United States Patent
Cohen

(10) Patent No.: US 7,403,417 B2
(45) Date of Patent: Jul. 22, 2008

(54) NON-VOLATILE SEMICONDUCTOR MEMORY DEVICE AND METHOD FOR OPERATING A NON-VOLATILE MEMORY DEVICE

(75) Inventor: Zeev Cohen, Zichron-Yaakov (IL)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 180 days.

(21) Appl. No.: 11/287,462

(22) Filed: Nov. 23, 2005

(65) Prior Publication Data

US 2007/0115720 A1     May 24, 2007

(51) Int. Cl.
G11C 16/06 (2006.01)
G11C 14/00 (2006.01)
G11C 7/00 (2006.01)
G11C 29/00 (2006.01)
G11C 7/02 (2006.01)

(52) U.S. Cl. .......................... 365/185.09; 365/185.08; 365/200; 365/201; 365/207

(58) Field of Classification Search ............ 365/185.08, 365/185.09, 200, 201, 207
See application file for complete search history.

(56) References Cited

U.S. PATENT DOCUMENTS

| | | | |
|---|---|---|---|
| 5,033,024 A | | 7/1991 | O'Connell et al. |
| 5,293,348 A | * | 3/1994 | Abe ................... 365/230.03 |
| 5,485,424 A | * | 1/1996 | Kawamura ............. 365/200 |
| 5,502,676 A | * | 3/1996 | Pelley et al. ........... 365/200 |
| 5,627,963 A | | 5/1997 | Gabillard et al. |
| 5,673,227 A | * | 9/1997 | Engles et al. ........... 365/200 |
| 5,968,183 A | | 10/1999 | Pascucci |
| 5,978,273 A | * | 11/1999 | Shigemura ............ 365/185.29 |
| 6,199,177 B1 | | 3/2001 | Blodgett |
| 6,201,744 B1 | * | 3/2001 | Takahashi ............. 365/200 |
| 6,243,306 B1 | | 6/2001 | Kirihata |
| 6,262,924 B1 | * | 7/2001 | Fukutani et al. ........ 365/200 |
| 7,085,179 B2 | * | 8/2006 | Park et al. ............. 365/200 |
| 2002/0001896 A1 | | 1/2002 | Yoon |
| 2002/0048191 A1 | * | 4/2002 | Ikehashi et al. ....... 365/185.22 |
| 2002/0141264 A1 | | 10/2002 | Mori et al. |
| 2002/0145936 A1 | * | 10/2002 | Maeda ................. 365/233 |
| 2003/0009615 A1 | | 1/2003 | Hsu et al. |

(Continued)

FOREIGN PATENT DOCUMENTS

| | | |
|---|---|---|
| EP | 0 377 249 A1 | 7/1990 |

(Continued)

*Primary Examiner*—Huan Hoang
*Assistant Examiner*—Lý Duy Pham
(74) *Attorney, Agent, or Firm*—Slater & Matsil, L.L.P.

(57) ABSTRACT

Embodiments of the invention relate to non-volatile memory devices and their methods of manufacture. Embodiments comprise an array of non-volatile memory cells, the array comprising a multiplicity of array columns having at least one redundant column of non-volatile memory cells adapted to replace a defective array column, a column decoder, and a column redundancy unit. The column decoder is adapted to receive an address of a memory cell to which data is to be written or from which data is to be read. The column redundancy unit is adapted to decide whether the decoded address is to be written to or read from an array from or a redundant column. The data required by the column redundancy unit is stored in a column redundancy memory, which is connected to the column redundancy unit by means of a dedicated column redundancy bus.

12 Claims, 4 Drawing Sheets

U.S. PATENT DOCUMENTS

| | | | |
|---|---|---|---|
| 2003/0072204 A1* | 4/2003 | Shiga et al. | 365/201 |
| 2003/0214861 A1* | 11/2003 | Takano et al. | 365/200 |
| 2004/0130953 A1 | 7/2004 | Ambroggi et al. | |
| 2004/0145946 A1* | 7/2004 | Ogawa | 365/185.09 |
| 2006/0018157 A1* | 1/2006 | Kawai | 365/185.09 |

FOREIGN PATENT DOCUMENTS

EP    0 567 707 A1    11/1993

* cited by examiner

NON-VOLATILE SEMICONDUCTOR MEMORY DEVICE AND METHOD FOR OPERATING A NON-VOLATILE MEMORY DEVICE

TECHNICAL FIELD

This invention relates generally to semiconductor memory, and more particularly to methods for manufacturing and operating, and structures for redundant memory array columns of non-volatile memory cells for replacing a defective array columns.

BACKGROUND

Non-volatile memory devices, such as electrical erasable programmable read-only memories (EEPROM) or flash EEPROMs usually comprise a relatively large amount of memory cells. The memory cells are, for example, modified MOSFET transistors with an additional floating gate or a nitride layer, which is used to store an electrical charge representing a programming state of the memory cell.

Such memory cells are usually arranged in an array structure, with the rows of the array being selected by an associated wordline and the columns of the array being selected by an associated bitline.

During manufacturing of such large semiconductor circuits, individual memory cells or entire rows or columns of the array can turn out to be defective. Consequently, in a wafer sort process, in which the memory devices are tested and defective cells are identified, these cells are marked as unusable.

In order to maintain the overall memory capacity of the memory device, most memory devices include a number of redundant columns of memory cells, which are configured to replace memory cells identified as being defective during the wafer sort process.

U.S. Pat. No. 5,968,183, which is incorporated herein by reference, describes a memory device with a column redundancy unit in a peripheral circuit area. In order to transfer data required by the column redundancy unit between the column redundancy unit and the memory area, a common data bus is used in a time-shared transfer approach.

According to the prior art, column redundancy data required to decide whether a particular memory cell of the array is being replaced by a cell in one of the redundant columns must be loaded over a data bus connecting, among others, the column redundancy unit and the memory area. The decision made by the column redundancy unit then needs to be transferred back over the data bus, before the read or write operation can take place. Thus, the time it takes to transfer this data over the data bus affects the speed of the memory device.

In general, there exists a need for faster memory devices with increased storage capacity. As a result, the processing of column redundancy data becomes more important and increasingly limits the overall performance of memory devices. Consequently, there is a need for non-volatile semiconductor memory device with increased performance.

SUMMARY OF THE INVENTION

These and other problems are generally solved or circumvented, and technical advantages are generally achieved by preferred embodiments of the present invention that provide methods and structures for semiconductor memory. In an embodiment, a column decoder is adapted to receive an address of a memory cell to which data is to be written or from which data is to be read. The column redundancy unit is adapted to decide whether the decoded address is to be written to or read from an array column or a redundant column. The data required by the column redundancy unit is stored in a column redundancy memory, which is connected to the column redundancy unit by a dedicated column redundancy bus.

By having a dedicated bus between the column redundancy unit and the column redundancy memory, data transfer between these two units can take place without occupying the data bus of the memory device. Consequently, other operations can take place on the data bus in parallel, for example, writing data to be written into an input latch or reading data read from the memory array from an output latch.

In addition, the data transfer on a dedicated bus can be made faster than on a shared data bus, because with a shared data bus other bus members, which are not involved in the transmission of the column redundancy data, may force the bus to operate at a lower speed.

According to an embodiment of the invention, the column redundancy memory is included within the column redundancy unit. By integrating the column redundancy memory into the column redundancy unit, transfer times between the memory and the column redundancy unit is minimized as the length of the dedicated bus also becomes minimal.

According to another embodiment of the invention, the column redundancy memory comprises a static memory. Using preferred fast static memories such as SRAM, the overall performance of the column redundancy unit can be further improved upon.

According to yet another embodiment of the invention, the memory device comprises a memory area, comprising the array of memory cells and the redundant columns of memory cells, and a circuitry area, comprising the column decoder, the column redundancy unit and the column redundancy memory. The memory area and the circuitry area are connected by a data bus, which can be used in parallel to the dedicated bus between the column redundancy unit and the column redundancy memory.

According to another aspect of the invention, a method for operating a non-volatile memory device is provided. In a first step of the method, column redundancy data is read from a non-volatile memory area and transferred to the column redundancy memory. This can take place, for example, during the initialization of the memory device. During operation, whenever the memory device receives a request to write or read data into the memory area, related column redundancy data is already stored in the column redundancy memory. This data is then loaded using a dedicated bus from the column redundancy memory into the column redundancy unit. The column redundancy unit uses the data in order to decide whether or not the address is contained in a defective array column, which this needs to be replaced by a redundant column, or can be written to or read from a memory cell of one of the array columns directly. The outcome of this decision, i.e. the control data required to access the physical memory cell to be used, is then transferred from the column redundancy unit to the memory area.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

The following list of reference symbols can be used in conjunction with the figures:

| | |
|---|---|
| 1 | memory device |
| 2 | memory area |
| 3 | circuitry area |
| 4 | array of memory cell |
| 5 | redundant column |
| 6 | bitline |
| 7 | column multiplexer |
| 8 | redundant bitline |
| 9 | redundant multiplexer |
| 10 | column decoder |
| 11 | column redundancy unit |
| 12 | first sense amplifier |
| 13 | second sense amplifier |
| 14 | selection multiplexer |
| 15 | output latch |
| 16 | data bus |
| 17 | column redundancy controller |
| 18 | column redundancy memory |
| 19 | dedicated bus |
| 20 | wordline |
| 21-47 | method steps |

DETAILED DESCRIPTION OF ILLUSTRATIVE EMBODIMENTS

Figure 1:
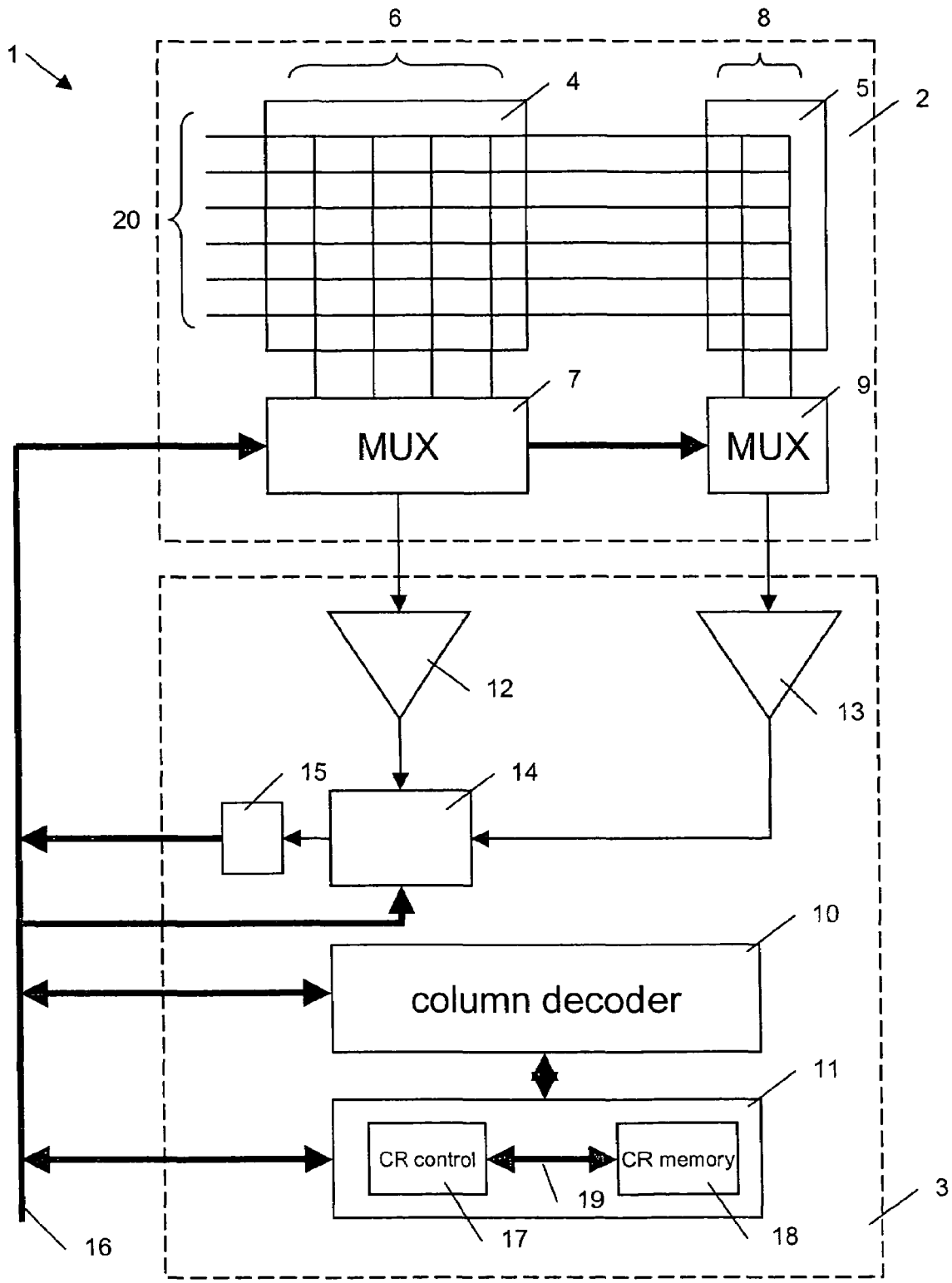
FIG. 1 shows a schematic setup of a non-volatile memory device in accordance with an embodiment of the present invention.

FIG. 1 shows a schematic setup of a semiconductor memory device 1 in accordance with an embodiment of the present invention. The memory device 1 comprises a memory area 2 and a circuitry area 3.

The memory area 2 comprises an array 4 of non-volatile memory cells organized in columns and rows and several redundant columns 5 of non-volatile memory cells. The rows of the array 4 and the columns 5 are connected by wordlines 20. The columns of the array 4 of memory cells are connected by bitlines 6 to a column multiplexer 7, which can be used to select one of the bitlines 6. The redundant columns 5 are connected by redundant bitlines 8 to a redundant multiplexer 9.

The circuitry area 3 comprises a column decoder 10, a column redundancy unit 11, two sense amplifiers 12 and 13 connected to the output of the column multiplexer 7 and the output of the redundant multiplexer 9, respectively, a selection multiplexer 14 and an output latch 15. The column decoder 10, the column redundancy unit 11, the selection multiplexer 14, the output latch 15 and the multiplexers 7 and 9 are connected by means of a data bus 16.

The column redundancy unit 11 comprises a column redundancy controller 17 and a column redundancy memory 18. The column redundancy controller 17 and the column redundancy memory 18 are connected by a dedicated column redundancy bus 19.

Figure 2:
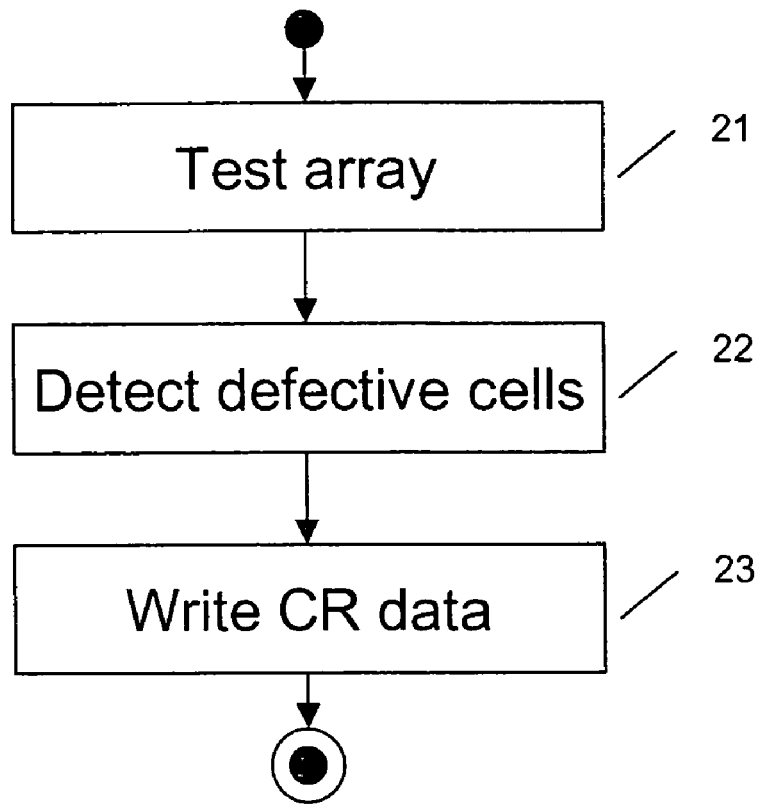
FIG. 2 shows a flow diagram of a method used during wafer sorting of an embodiment of the present invention.

FIG. 2 shows a method performed during the so-called wafer sort process used during the manufacturing of memory devices 1 in accordance with an embodiment of the present invention.

In a first step 21, the memory device 1 is connected to a memory device tester, which performs predefined tests to test whether the device 1 is working in accordance to a predefined specification or not.

In a step 22, defective memory cells are detected. These are, for example, memory cells that have been rendered useless by impurities of the substrate used in the manufacturing process. Such defect can take the form of short or open circuits, for example in the bitlines 6 or worldlines 20 of the array 4.

In a step 23, the information about the defective memory cells detected in step 22 is written into a predefined area of the non-volatile memory device 1. Consequently, this information is available to the memory device 1 during its life cycle. The predefined area can be part of the memory array 4, for example, or comprise a group of fuses or a fuse box, in which fuses are blown by means of high currents or cut by lasers as part of the testing process.

Figure 3:
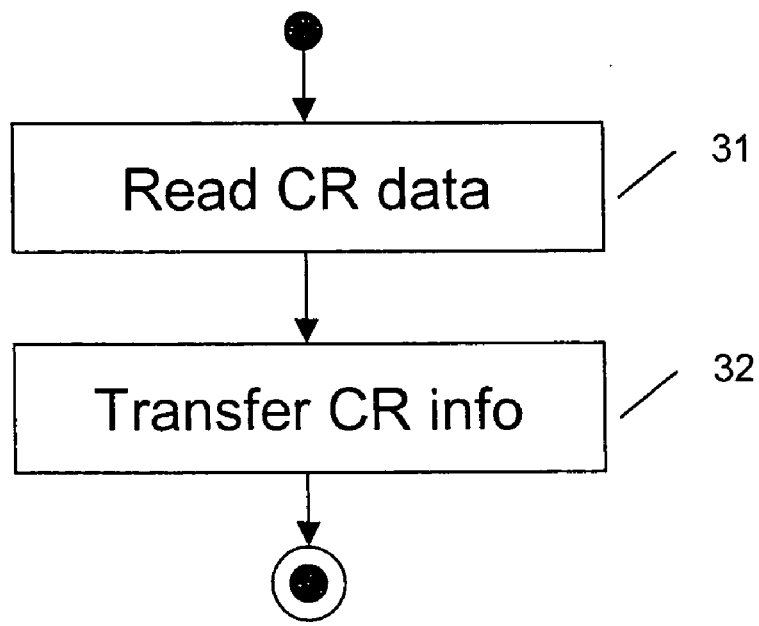
FIG. 3 shows a method for initialization of a semiconductor memory device in accordance with an embodiment of the present invention.

FIG. 3 shows a method for initialization of a memory device 1 in accordance with an embodiment of the present invention.

In a first step 31, for example after initially powering up the memory device 1, the column redundancy data, written into a predetermined area during the wafer sort process in step 23, is read from the predetermined area of memory. This data contains information about defective memory cells or array 4 columns of memory cells in an encoded and compact format.

The obtained information is then transferred to the column redundancy memory 18 in step 32. In the embodiment described in FIG. 1, the column redundancy information stored at the predetermined area is read from the array 4 and transferred over the data bus 16 to the column redundancy unit 11, where it is stored in the column redundancy memory 18. Thus, during initialization of the memory device 1, the column redundancy data is transferred from the memory area 2 to the column redundancy unit 11 using the data bus 16.

Figure 4:
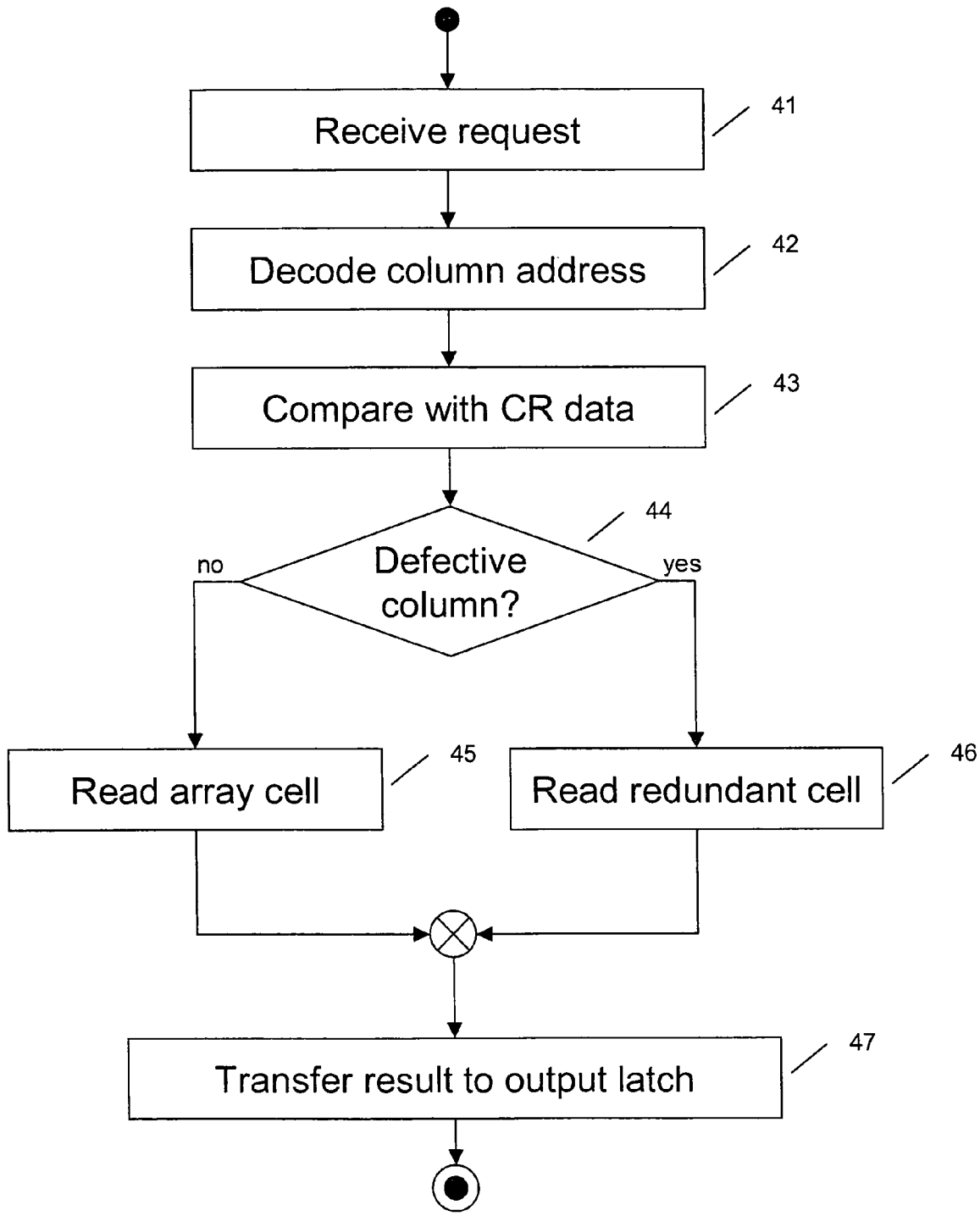
FIG. 4 shows a flow diagram for a method for reading a memory cell of a semiconductor memory device in accordance with an embodiment of the present invention.

A method for reading a memory cell of the memory device 1 in accordance with an embodiment of the present invention is presented in FIG. 4.

In a first step 41, the request for reading a cell of the memory device 1 is received. For example, this request can be received by the column decoder 10 arranged in the circuitry area 3.

In a step 42, the received request is decoded, with the decoded column address being transferred from the column decoder 10 to the column redundancy unit 11. Depending whether the column decoder 10 and the column redundancy unit 11 are included within a single unit or are separate, as shown in FIG. 1 for example, the decoded column address might either be transferred from the column decoder 10 to the column redundancy 11 directly or by means of the data bus 16.

The received address is then checked by the column redundancy controller 17. In order to do so, the column redundancy controller 17 compares the decoded column address with addresses of defective memory cells or columns of the array 4 stored in the column redundancy memory 18, step 43. Typically, only a small part of the data stored in the column redundancy memory 18 is selected and transferred into the column redundancy controller 17. Since all accesses to the column redundancy memory 18 are performed using the dedicated bus 19, the data bus 16 remains free for other operations during this time.

The column redundancy controller 17 can be implemented, for example, in form of a purpose designed array logic or an all-purpose controller in combination with computer code adapted to perform the required operations.

The specific data format of the column redundancy data stored in the column redundancy memory 18 and used by the column redundancy controller 17 will depend on the design and set-up of the memory device 1 in general and the memory area 2 in particular. According to another embodiment of the present invention the memory array 4 is organized in slices, which comprise groups of memory cells of an array column.

Based on the data stored in the column redundancy memory 18, the column redundancy controller 17 can make a decision whether to use the array 4, the column multiplexer 7 and the first sense amplifier 12 or the redundant columns 5, the redundant multiplexer 9 and the second sense amplifier 13 for the subsequent read operation. This is performed in step 44. Essentially, the decision comprises the information which bitline 6 or redundant bitline 8 needs to be selected by the column or redundant multiplexer 7 or 9, and which of the first and second sense amplifiers 12 and 13 needs to be selected by the selection multiplexer 14. This information is transferred from the column redundancy unit 11 to the multiplexers 7 or 9 and the selection multiplexer 14 by means of the data bus 16, for example. Alternatively, a separate control bus can be used, which is not shown in FIG. 1.

If the memory cell or column of the array 4, which is mapped to the received address, is not defective, in a step 45, this memory cell of the array 4 is read using the sense amplifier 12. To this end, the wordline 20 corresponding to the memory cell is activated by means of a control electronic not shown in FIG. 1, and the corresponding bitline 6 is selected by the column multiplexer 7. The first sense amplifier 12 then measures a current through or voltage across the selected memory cell of the array 4. Different methods and apparatuses for reading the programming state of a memory cell are known from the prior art and can be used in combination with the present invention as will be obvious to a person skilled in the art.

Alternatively, in a step 46, if the memory cell or column to be read was identified to be defective by the column redundancy controller 17, a redundant bitline 8 is selected by the redundant multiplexer 9 and the selection multiplexer 14 selects the output of the second sense amplifier 13. The reading process is performed as described in step 45 with the only difference being that instead of a column of the array 4, a redundant bitline 8 of a redundant column 5 is used during the reading operation.

In a step 47, the output of the first sense amplifier 12 or the second sense amplifier 13 is transferred from the selection multiplexer 14 to an output latch 15. From there, the returned value can be transferred over the data bus 16, for example to an interface of the memory device 1 not shown in FIG. 1.

Performing write operations on a memory device 1 is carried out in a similar fashion as described above and shown in FIG. 4 for the read operation. Instead of using sense amplifiers 12 and 13, programming circuitry is used to program the state of a memory cell of either the array 4 or the redundant columns 5 to a predefined state. The required circuitry and steps of the procedure are not, however, presented in FIG. 1 and FIG. 4, respectively, as they will be obvious to a person skilled in the art.

Figure 5:
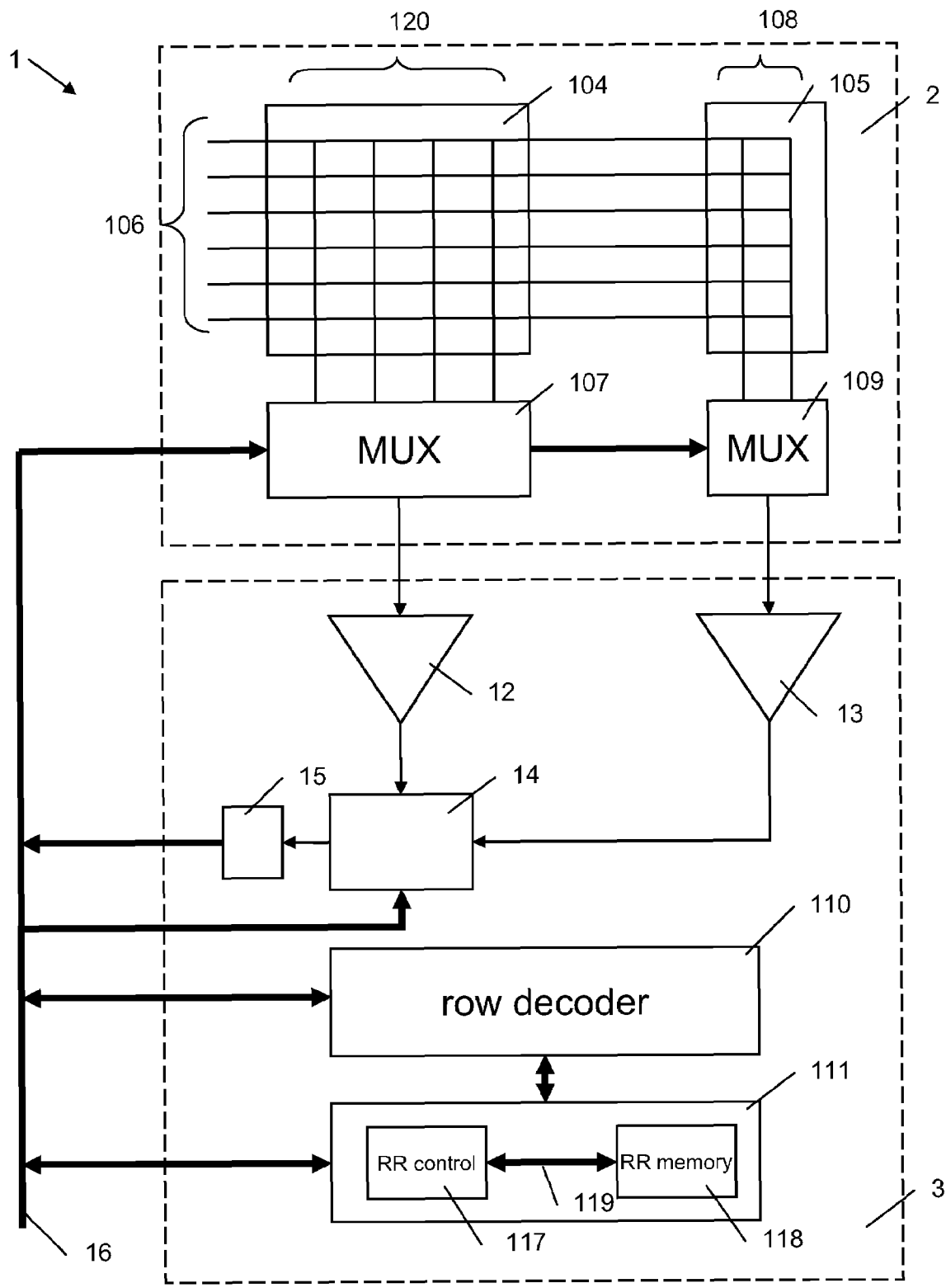
FIG. 5 shows a schematic setup of a non-volatile memory device in accordance with an embodiment of the present invention.

Although the description and figures presented above describe a redundancy scheme of a memory device 1 used to replace parts or all of a defective array column, connected to a bitline 6, similar means and procedures can, of course, be used to implement a redundancy scheme for replacing rows of the array connected to a common wordline 20. Due to the current design of memory devices 1, column redundancy units 11 need to be operated much faster than row redundancy units. However, it is explicitly noted here that future changes to the design of memory devices 1 might result in the need for faster row redundancy units, which could be implemented in a similar fashion as described above without departing from the idea of the present invention. Such an embodiment is illustrated in FIG. 5. The memory area 2 comprises an array 104 of non-volatile memory cells organized in columns and rows and several redundant columns 105 of non-volatile memory cells. The columns of the array 104 and the columns 105 are connected by bitlines 106. The rows of the array 104 of memory cells are connected by wordlines 120 to a row multiplexer 107 which can be used to select one of the wordlines 120. The redundant columns 105 are connected by redundant wordlines 108 to a redundant multiplexer 109. An integrated row redundancy unit 111 comprises a row redundancy controller 117 and a row redundancy memory 118. A dedicated row redundancy bus 119 connects the row redundancy controller 117 with the row redundancy memory 118. A row decoder 110 is adapted to receive an address of a memory cell to which data is to be written or from which data is to be read.

Equally, the scheme could be applied to a memory array 4 or 5 in which more than one bitline 6 or 8 is selected simultaneously, for example for a differential read-out of a memory cell connected by two bitlines 6 or 8, respectively.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A non-volatile semiconductor memory device, comprising:

a memory area;

a circuitry area;

an array of non-volatile memory cells, the array comprising a multiplicity of array columns and at least one redundant column of non-volatile memory cells adapted to replace a defective array column, wherein the memory area comprises the multiplicity of array columns and the at least one redundant column of non-volatile memory cells;

a data bus coupled to the array to carry data to and from the array, the data bus connecting the memory area and the circuitry area;

a column decoder coupled to the data bus, wherein the column decoder is adapted to receive an address of a memory cell to which data is to be written to or from which data is to be read, the address being received on the data bus, wherein the circuitry area comprises the column decoder; and a column redundancy unit coupled to the data bus, the column redundancy unit including a column redundancy memory and a column redundancy controller, wherein the column redundancy controller is adapted to determine whether data corresponding to the decoded address is to be written to or read from an array column or a redundant column, and wherein column redundancy data required by the column redundancy unit is stored in the column redundancy memory, which is connected to the column redundancy controller by a dedicated column redundancy bus, wherein the circuitry area comprises the column redundancy controller, the column redundancy memory, and the dedicated column redundancy bus.

2. The non-volatile semiconductor memory device according to claim 1, wherein the column redundancy memory comprises a static random access memory (SRAM).

3. The non-volatile semiconductor memory device according to claim 1, wherein the memory area further comprises:

a column multiplexer having inputs connected to the multiplicity of array columns and an output connected to the circuitry area; and a redundant multiplexer having at least one input connected to the at least one redundant column of non-volatile memory cells and an output connected to the circuitry area.

4. The non-volatile semiconductor memory device according to claim 3, wherein the circuitry area further comprises first and second sense amplifiers connected to the column and redundant multiplexers, respectively, having inputs and outputs connected to a selection multiplexer, which has an output connected to an output latch.

5. The non-volatile semiconductor memory device according to claim 1, wherein the column redundancy data stored in the column redundancy memory is organized as slices comprising groups of memory cells in individual columns of the multiplicity of array columns.

6. The non-volatile semiconductor memory device according to claim 1, wherein the multiplicity of array columns and the at least one redundant column of non-volatile memory cells comprise a differential readout for the memory cells.

7. A non-volatile semiconductor memory device, comprising:

a memory area;

a circuitry area;

an array of non-volatile memory cells, the array comprising a multiplicity of array rows and at least one redundant row of non-volatile memory cells adapted to replace a defective array row, wherein the memory area comprises the multiplicity of array rows and the at least one redundant row of non-volatile memory cells; and a data bus-coupled to the array to carry data to and from the array, the data bus connecting the memory area and the circuitry area;

a row decoder coupled to the data bus, wherein the row decoder is adapted to receive an address of a memory cell to which data is to be written or from which data is to be read, the address being received on the data bus, wherein the circuitry area comprises the row decoder; and a row redundancy unit coupled to the data bus, the row redundancy unit including a row redundancy memory and a row redundancy controller, wherein the row redundancy controller is adapted to determine whether data corresponding to the decoded address is to be written to or read from an array row or a redundant row, and wherein row redundancy data required by the row redundancy unit is stored in the row redundancy memory, which is connected to the row redundancy controller by a dedicated row redundancy bus, wherein the circuitry area comprises the row redundancy unit.

8. The non-volatile semiconductor memory device according to claim 7, wherein the row redundancy memory comprises a static random access memory (SRAM).

9. The non-volatile semiconductor memory device according to claim 7, wherein the memory area further comprises:

a row multiplexer having inputs connected to the multiplicity of array rows and an output connected to the circuitry area; and a redundant multiplexer having at least one input connected to the at least one redundant row of non-volatile memory cells and an output connected to the circuitry area.

10. The non-volatile semiconductor memory device according to claim 9, wherein the circuitry area further comprises first and second sense amplifiers connected to the row and redundant multiplexers, respectively, having inputs and outputs connected to a selection multiplexer, which has an output connected to an output latch.

11. The non-volatile semiconductor memory device according to claim 7, wherein the row redundancy data stored in the row redundancy memory is organized as slices comprising groups of memory cells in individual rows of the multiplicity of array rows.

12. The non-volatile semiconductor memory device according to claim 7, wherein the multiplicity of array rows and the at least one redundant row of non-volatile memory cells comprise a differential readout for the memory cells.

* * * * *